US011640716B2

(12) United States Patent
Wan et al.

(10) Patent No.: US 11,640,716 B2
(45) Date of Patent: May 2, 2023

(54) LANE CURVATURE DETERMINATION

(71) Applicant: Ford Global Technologies, LLC, Dearborn, MI (US)

(72) Inventors: Mengxiong Wan, Troy, MI (US); Akshat Rajvanshi, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 239 days.

(21) Appl. No.: 17/124,769

(22) Filed: Dec. 17, 2020

(65) Prior Publication Data

US 2022/0198197 A1 Jun. 23, 2022

(51) Int. Cl.
*G06T 7/10* (2017.01)
*G06F 30/23* (2020.01)
*G06V 20/56* (2022.01)
*B60W 30/12* (2020.01)

(52) U.S. Cl.
CPC ........... *G06V 20/588* (2022.01); *B60W 30/12* (2013.01); *G06F 30/23* (2020.01); *G06T 7/10* (2017.01); *B60W 2552/30* (2020.02); *G06T 2207/30256* (2013.01)

(58) Field of Classification Search
None
See application file for complete search history.

(56) References Cited

U.S. PATENT DOCUMENTS

| | | | |
|---|---|---|---|
| 8,751,157 B2 | 6/2014 | Simon | |
| 2019/0071126 A1* | 3/2019 | Giersiefer | B62D 15/025 |
| 2019/0102840 A1* | 4/2019 | Perl | G06Q 40/08 |
| 2019/0129437 A1* | 5/2019 | Liu | B60W 40/02 |
| 2019/0329766 A1* | 10/2019 | Ishioka | B60W 30/095 |
| 2020/0073396 A1* | 3/2020 | Shimizu | G05D 1/0219 |

FOREIGN PATENT DOCUMENTS

| | | |
|---|---|---|
| CN | 107798855 B | 5/2020 |
| WO | 2018016507 A1 | 1/2018 |

OTHER PUBLICATIONS

Khan et al., "Lane detection using lane boundary marker network with road geometry constraints", This WACV 2020 paper is the Open Access version, provided by the Computer Vision Foundation. Except6 for the watermark, it is identical to the accepted version; the final published version of the proceedings is available on IEEE Xplore.

* cited by examiner

*Primary Examiner* — Idowu O Osifade
(74) *Attorney, Agent, or Firm* — Frank A. MacKenzie; Bejin Bieneman PLC

(57) ABSTRACT

A computer includes a processor and a memory storing instructions executable by the processor to receive a series of sample coordinate points of a projected path of travel of a vehicle, generate interpolated coordinate points along the projected path between the sample coordinate points, fit a curve to the sample coordinate points and interpolated coordinate points, and output a curvature of a lane at a reported coordinate point along the projected path based on the curve.

19 Claims, 5 Drawing Sheets

LANE CURVATURE DETERMINATION

BACKGROUND

Autonomous features of a vehicle, from lane-keeping assist to fully autonomous operation, can benefit from determining a curvature of a lane of travel of the vehicle. One way to determine curvature is vision-based, using image recognition techniques on image data from forward-facing cameras to recognize the lane markers. Vision-based techniques are limited by a look-ahead distance of the cameras and by environmental conditions like rain or fog. Another way to determine curvature is using map data. However, currently available map data is often limited to providing curvature for an entire roadway, not a specific lane within the roadway.

DETAILED DESCRIPTION

Figure 1:
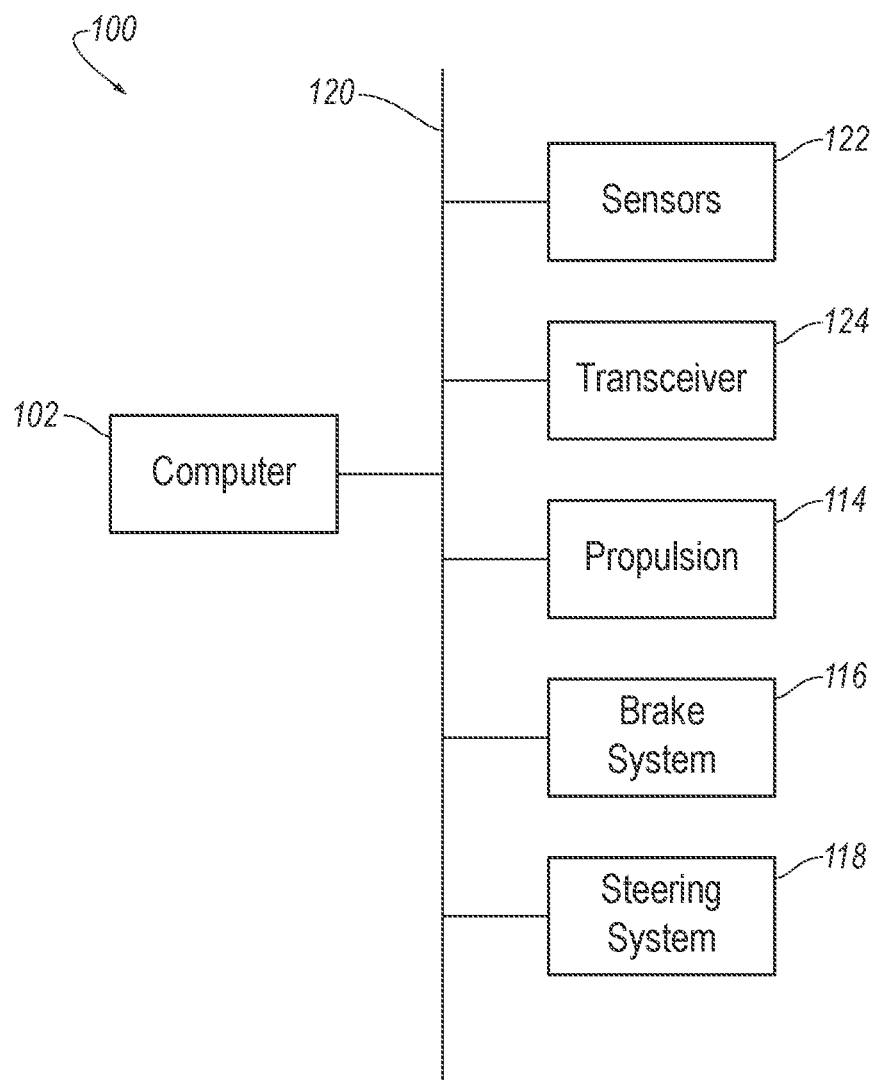
FIG. 1 is a block diagram of an example vehicle.

The system described herein can determine a curvature of a lane of travel of a vehicle. The curvature can be provided for operating the vehicle autonomously or semi-autonomously. The curvature determination has a greater look-ahead distance, i.e., provides data for a greater distance ahead of the vehicle along the roadway, than a vision-based system. The curvature determination is accurate for the specific lane in which the vehicle 100 is traveling.

A computer includes a processor and a memory storing instructions executable by the processor to receive a series of sample coordinate points of a projected path of travel of a vehicle, generate interpolated coordinate points along the projected path between the sample coordinate points, fit a curve to the sample coordinate points and interpolated coordinate points, and output a curvature of a lane at a reported coordinate point along the projected path based on the curve.

The instructions may include instructions to actuate a system of the vehicle based on the curvature.

The instructions may include instructions to calculate preliminary curvatures of the curve at a plurality of intermediate coordinate points before and after the reported coordinate point along the projected path, and the intermediate coordinate points may be a subset of the sample coordinate points and interpolated coordinate points. Outputting the curvature at the reported coordinate point may be based on the preliminary curvatures.

The instructions may include instructions to, for the intermediate coordinate points, calculate mean curvatures of at least some of the preliminary curvatures. The instructions may include instructions to calculate a mean of the mean curvatures that are within a preset distance before and after the reported coordinate point along the projected path, and the mean may be the curvature at the reported coordinate point. The preset distance may be a first preset distance, and calculating each respective mean curvature may include averaging the preliminary curvatures that are within a second preset distance before and after the respective intermediate coordinate point. The intermediate coordinate points may be within a third preset distance of the reported coordinate point, the second preset distance may be less than the third preset distance.

Generating the interpolated coordinate points may include applying a piecewise cubic Hermite interpolation polynomial to the sample coordinate points.

The curve may be a polynomial. The curve may be a cubic polynomial.

The sample coordinate points may include, in consecutive order, a first sample coordinate point, a second sample coordinate point, and a third sample coordinate point; the reported coordinate point may be between the first sample coordinate point and the third sample coordinate point along the projected path; and the instructions may include instructions to, in response to an angle between a first vector from the first sample coordinate point to the second sample coordinate point and a second vector from the second sample coordinate point to the third sample coordinate point being below a threshold angle, output that the curvature at the reported coordinate point is zero.

The instructions may include instructions to generate a line perpendicular to the curve at the reported coordinate point, and determine a width of the lane at the reported coordinate point using the perpendicular line. Determining the width of the lane may include determining two intersection points between the perpendicular line and two respective lane boundaries, and the width of the lane may be a distance between the two intersection points. The instructions may include instructions to receive a series of lane-boundary coordinate points of the lane boundaries, and for each lane boundary, generate interpolated lane-boundary coordinate points along that lane boundary between the lane-boundary coordinate points; and the intersection points may be located where the perpendicular line intersects the interpolated lane-boundary coordinate points.

The sample coordinate points may be located along centers of multiple lanes including the lane, and the instructions may include instructions to select a subset of the sample coordinate points according to which of the lanes the projected path is in. Only the sample coordinate points in the subset may be used to fit the curve.

The instructions may include instructions to determine the projected path based on navigation directions stored in the memory.

The instructions may include instructions to determine the projected path based on at least one rule ranking types of lanes.

A method includes receiving a series of sample coordinate points of a projected path of travel of a vehicle, generating interpolated coordinate points along the projected path between the sample coordinate points, fitting a curve to the sample coordinate points and interpolated coordinate points, and outputting a curvature of a lane at a reported coordinate point along the projected path based on the curve.

With reference to the Figures, a computer 102 for a vehicle 100 includes a processor and a memory storing instructions executable by the processor to receive a series of sample coordinate points 104 of a projected path 106 of travel of the vehicle 100, generate interpolated coordinate points 108 along the projected path 106 between the sample coordinate points 104, fit a curve to the sample coordinate points 104 and interpolated coordinate points 108, and output a curvature of a lane 110 at a reported coordinate point 112 along the projected path 106 based on the curve.

For the purposes of this disclosure, a "coordinate point" is a location in space represented in a coordinate system, e.g., two orthogonal linear dimensions x, y.

With reference to FIG. 1, the vehicle 100 may be any suitable type of automobile, e.g., a passenger or commercial automobile such as a sedan, a coupe, a truck, a sport utility, a crossover, a van, a minivan, a taxi, a bus, etc.

The vehicle 100 can be an autonomous or semi-autonomous vehicle. The computer 102 can be programmed to operate the vehicle 100 independently of the intervention of a human operator, completely or to a lesser degree. The computer 102 may be programmed to operate a propulsion 114, a brake system 116, a steering system 118, and/or other vehicle systems. For the purposes of this disclosure, autonomous operation means the computer 102 controls the propulsion 114, brake system 116, and steering system 118 without input from a human operator; semi-autonomous operation means the computer 102 controls one or two of the propulsion 114, brake system 116, and steering system 118 and a human operator controls the remainder; and nonautonomous operation means a human operator controls the propulsion 114, brake system 116, and steering system 118.

The computer 102 is a microprocessor-based computing device, e.g., a generic computing device including a processor and a memory, an electronic controller or the like, a field-programmable gate array (FPGA), an application-specific integrated circuit (ASIC), etc. The computer 102 can thus include a processor, a memory, etc. The memory of the computer 102 can include media for storing instructions executable by the processor as well as for electronically storing data and/or databases, and/or the computer 102 can include structures such as the foregoing by which programming is provided. The computer 102 can be multiple computers coupled together.

The computer 102 may transmit and receive data through a communications network 120 such as a controller area network (CAN) bus, Ethernet, WiFi, Local Interconnect Network (LIN), onboard diagnostics connector (OBD-II), and/or by any other wired or wireless communications network. The computer 102 may be communicatively coupled to sensors 122, a transceiver 124, the propulsion 114, the brake system 116, the steering system 118, and other components via the communications network 120.

The sensors 122 may provide data about operation of the vehicle 100, for example, wheel speed, wheel orientation, and engine and transmission data (e.g., temperature, fuel consumption, etc.). The sensors 122 may detect the location and/or orientation of the vehicle 100. For example, the sensors 122 may include global positioning system (GPS) sensors; accelerometers such as piezo-electric or microelectromechanical systems (MEMS); gyroscopes such as rate, ring laser, or fiber-optic gyroscopes; inertial measurements units (IMU); and magnetometers. The sensors 122 may detect the external world, e.g., objects and/or characteristics of surroundings of the vehicle 100, such as other vehicles, road lane markings, traffic lights and/or signs, pedestrians, etc. For example, the sensors 122 may include radar sensors, scanning laser range finders, light detection and ranging (LIDAR) devices, and image processing sensors such as cameras.

The transceiver 124 is adapted to transmit signals wirelessly through any suitable wireless communication protocol, such as Bluetooth®, WiFi, IEEE 802.11a/b/g, other RF (radio frequency) communications, etc. The transceiver 124 may be adapted to communicate with a remote server, that is, a server distinct and spaced from the vehicle 100. The remote server may be located outside the vehicle 100. For example, the remote server may be associated with another vehicle (e.g., V2V communications), an infrastructure component (e.g., V2I communications via Dedicated Short-Range Communications (DSRC) or the like), an emergency responder, a mobile device associated with the owner of the vehicle 100, etc. The transceiver 124 may be one device or may include a separate transmitter and receiver.

The propulsion 114 of the vehicle 100 generates energy and translates the energy into motion of the vehicle 100. The propulsion 114 may be a conventional vehicle 100 propulsion subsystem, for example, a conventional powertrain including an internal-combustion engine coupled to a transmission that transfers rotational motion to wheels; an electric powertrain including batteries, an electric motor, and a transmission that transfers rotational motion to the wheels; a hybrid powertrain including elements of the conventional powertrain and the electric powertrain; or any other type of propulsion. The propulsion 114 can include an electronic control unit (ECU) or the like that is in communication with and receives input from the computer 102 and/or a human operator. The human operator may control the propulsion 114 via, e.g., an accelerator pedal and/or a gear-shift lever.

The brake system 116 is typically a conventional vehicle braking subsystem and resists the motion of the vehicle 100 to thereby slow and/or stop the vehicle 100. The brake system 116 may include friction brakes such as disc brakes, drum brakes, band brakes, etc.; regenerative brakes; any other suitable type of brakes; or a combination. The brake system 116 can include an electronic control unit (ECU) or the like that is in communication with and receives input from the computer 102 and/or a human operator. The human operator may control the brake system 116 via, e.g., a brake pedal.

The steering system 118 is typically a conventional vehicle steering subsystem and controls the turning of the wheels. The steering system 118 may be a rack-and-pinion system with electric power-assisted steering, a steer-by-wire system, as both are known, or any other suitable system. The steering system 118 can include an electronic control unit (ECU) or the like that is in communication with and receives input from the computer 102 and/or a human operator. The human operator may control the steering system 118 via, e.g., a steering wheel.

Figure 2:
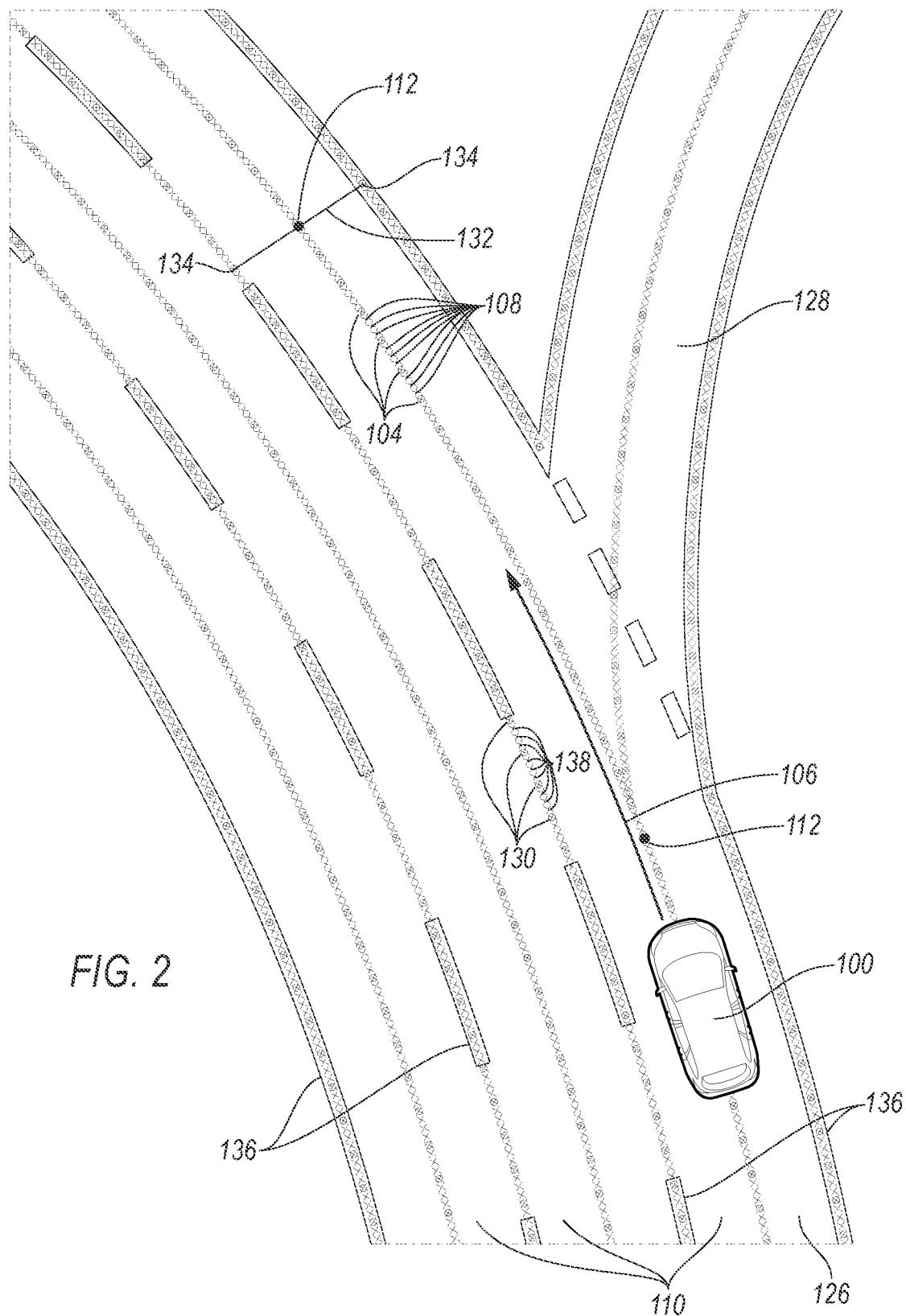
FIG. 2 is a diagram of coordinate points along a roadway including a projected path of the vehicle.

With reference to FIG. 2, the vehicle 100 is traveling along a roadway 126 in one of the lanes 110, e.g., the rightmost lane 110 as shown. The lanes 110 are defined by lane boundaries 136. The vehicle 100 follows the projected path 106. The projected path 106 is the most likely sequence of positions of the vehicle 100 over time, for which each position can be represented as the lane 110 in which the vehicle 100 is located and a location along the length of the lane 110. For example, the projected path 106 shown in FIG. 2 is to stay in the rightmost lane 110 and not take an offramp 128.

The lanes 110 and the roadway 126 are represented by a series of coordinate points 104, 108, 112, 130, 138, including the sample coordinate points 104, the interpolated coordinate points 108, the reported coordinate points 112, lane-boundary coordinate points 130, and interpolated lane-boundary coordinate points 138. The sample coordinate points 104 are located along centers of multiple lanes 110 including the lane 110 in which the vehicle 100 is currently traveling and, e.g., may be received from a remote server, as described below with respect to a block 405 of a process 400. The interpolated coordinate points 108 are generated along the projected path 106 between the sample coordinate points 104, as described below with respect to a block 415 of the process 400, thereby increasing a linear density of the coordinate points 104, 108 along the center of the lane 110. The reported coordinate points 112 are coordinate points for which a curvature will be outputted in a block 465 in the process 400 below and for which lane width will be outputted in a block 545 in a process 500 below. The lane-boundary coordinate points 130 are located along the lane boundaries 136 of multiple lanes 110 including the lane 110 in which the vehicle 100 is currently traveling and, e.g., may be received from the remote server along with the sample coordinate points 104, as described below with respect to a block 505 of the process 500. The interpolated lane-boundary coordinate points 138 are generated along each lane boundary 136 between the lane-boundary coordinate points 130, as described below with respect to a block 515 of the process 500, thereby increasing a linear density of the coordinate points 130, 138 along the lane boundaries 136 of the lanes 110.

Figure 3:
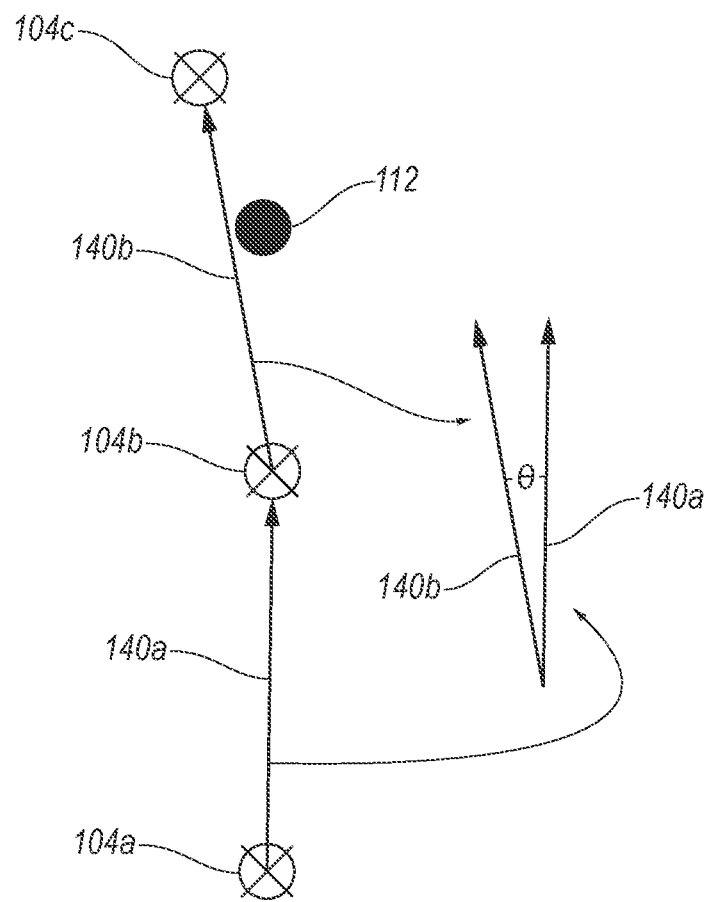
FIG. 3 is a diagram of an angle between consecutive sample points along the projected path of the vehicle.

With reference to FIG. 3, the sample coordinate points 104 are arranged in order along the projected path 106, as described below with respect to a block 410 of the process 400, e.g., a first sample coordinate point 104*a*, a second sample coordinate point 104*b*, a third sample coordinate point 104*c*, etc. The sample coordinate points 104 as provided by the remote server may have variable spacing based on an angle θ between consecutive vectors 140 between consecutive sample coordinate points 104. For example, as shown in FIG. 3, a first vector 140*a* extends from the first sample coordinate point 104*a* to the second sample coordinate point 104*b*, and a second vector 140*b* extends from the second sample coordinate point 104*b* to the third sample coordinate point 104*c*. The angle θ between the vectors 140 is measured with the tails of the vectors 140 touching, as is customary with angles between vectors. The sample coordinate points 104 may have greater linear density when the angle θ is larger and lower linear density when the angle θ is smaller, as described below with respect to a decision block 435 of the process 400. Additionally, the sample coordinate points 104 may have greater linear density when the speed of the vehicle 100 is lower. For example, the linear density may decrease linearly with the speed of the vehicle 100 up to a threshold speed and be constant above the threshold speed, e.g., from one sample coordinate point 104 per two meters at zero miles per hour down to one sample coordinate point 104 per fifteen meters at a threshold speed of seventy miles per hour, and also sample coordinate points 104 may be omitted when the angle θ is smaller than a threshold angle, thereby decreasing the linear density. The threshold angle is described below with respect to the decision block 435 of a process 400.

Figure 4:
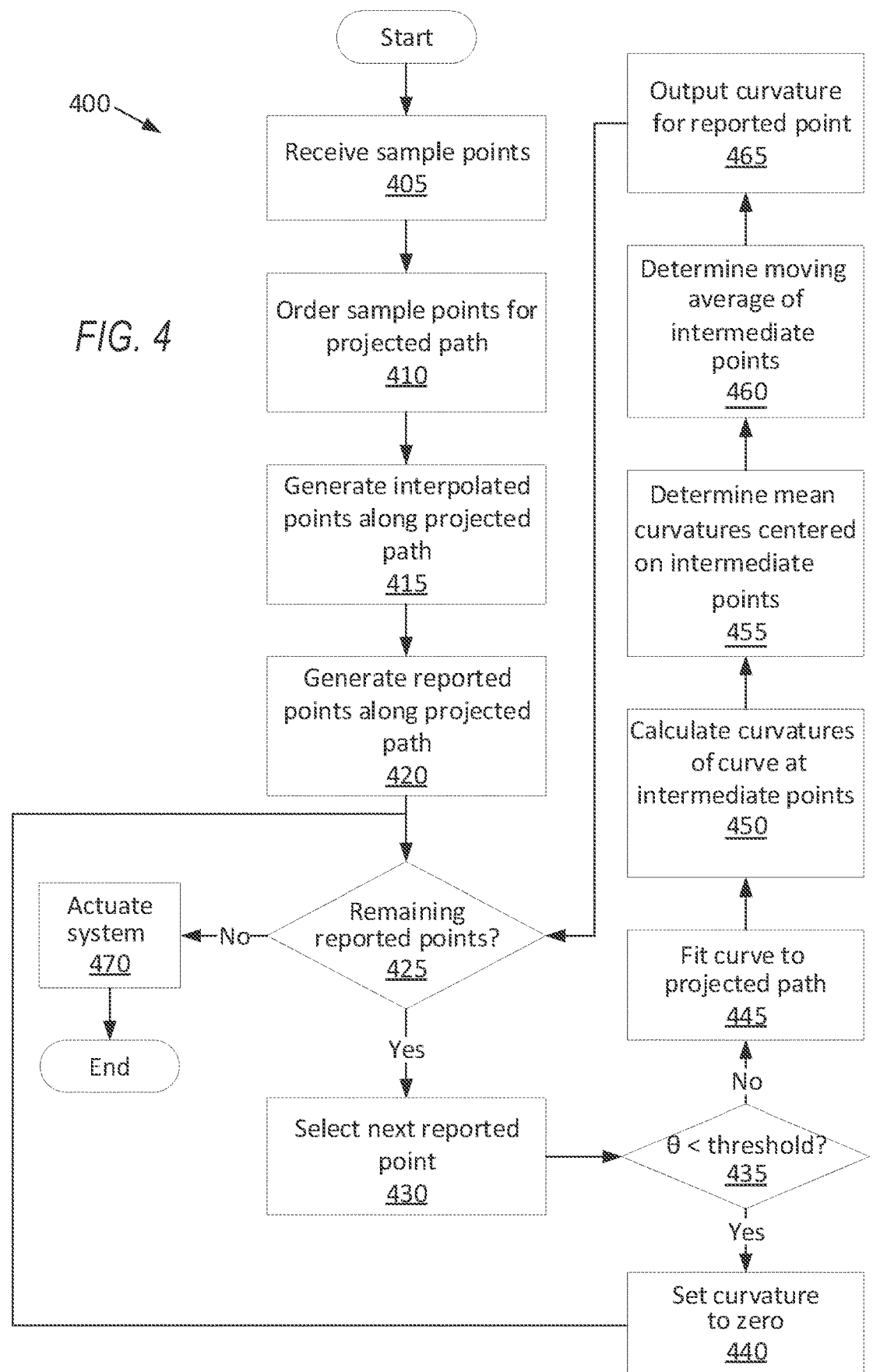
FIG. 4 is a process flow diagram of an example process for outputting a curvature of a lane of travel of the vehicle.

FIG. 4 is a process flow diagram illustrating an exemplary process 400 for outputting the curvature of the lane 110 of travel of the vehicle 100. The memory of the computer 102 stores executable instructions for performing the steps of the process 400 and/or programming can be implemented in structures such as mentioned above. As a general overview of the process 400, the computer 102 receives the sample coordinate points 104, orders the sample coordinate points 104 according to the projected path 106, and generates the interpolated coordinate points 108 between the sample coordinate points 104 along the projected path 106. For each reported coordinate point 112, the computer 102 sets the curvature to zero if the angle θ between consecutive vectors 140 between sample coordinate points 104 is less than a threshold angle. If the angle θ is greater than the threshold angle for that reported coordinate point 112, the computer 102 fits a curve to the sample coordinate points 104 and interpolated coordinate points 108 along the projected path 106, calculates preliminary curvatures at intermediate coordinate points (a subset of the sample coordinate points 104 and interpolated coordinate points 108) based on the curve, calculates mean curvatures at the intermediate coordinate points from the preliminary curvatures within a second preset distance before and after the respective intermediate coordinate points, calculates a mean of the mean curvatures at the reported coordinate point 112, and outputs the mean as the curvature at the reported coordinate point 112. The computer 102 actuates a system, e.g., one or more of the propulsion 114, the brake system 116, and the steering system 118, based on the curvature.

The process 400 begins in a block 405, in which the computer 102 receives the sample coordinate points 104. For example, a remote server can transmit the sample coordinate points 104 to the computer 102 via the transceiver 124. For another example, the computer 102 can access the sample coordinate points 104 for an upcoming region of the roadway 126 from memory. The sample coordinate points 104 are located along centers of multiple lanes 110 including the lane 110 in which the vehicle 100 is currently traveling, for an upcoming length of the roadway 126, e.g., the next three hundred meters of the roadway 126. The length can be chosen based on the availability of the sample coordinate points 104 and the speed of the vehicle 100, which dictates how far in advance the curvature will be used for actuating the system in a block 470 below. The sample coordinate points 104 can be represented in two linear orthogonal horizontal dimensions x, y. The sample coordinate points 104 can be arranged in a preset recurring distance along the respective lane 110, e.g., every five meters; can have varying distances between adjacent sample coordinate points 104; or a combination of both, e.g., greater density along curved segments and lesser density along straight segments of the roadway 126, in addition to possibly varying with the speed of the vehicle 100.

Next, in a block 410, the computer 102 determines the projected path 106 and selects and orders a subset of the sample coordinate points 104 according to the projected path 106. The projected path 106 can be determined from navigation directions stored in memory. The computer 102 can include or be in communication with a navigation unit. For example, for the situation depicted in FIG. 2, the navigation directions could be that the vehicle 100 should stay on the roadway 126, shown as a freeway, or that the vehicle 100 should follow the offramp 128. For another example, the projected path 106 can be determined based on a rule or rules ranking types of lanes 110, e.g., first, the lane 110 in which the vehicle 100 is currently traveling; second, the lane 110 adjacent to the lane 110 in which the vehicle 100 is currently traveling; third, the offramp 128; etc. The ranking of types of lanes 110 can be based on relative probabilities of vehicles following the types of lanes 110. The computer 102 selects the subset of the sample coordinate points 104 that are in the lane 110 or sequence of lanes 110 representing the projected path 106. The remainder of the process 400 operates with only the sample coordinate points 104 in the subset. The selected sample coordinate points 104 are then arranged in a series in the order in which the vehicle 100 will cross the sample coordinate points 104.

Next, in a block 415, the computer 102 generates the interpolated coordinate points 108 along the projected path 106 between the sample coordinate points 104, specifically, only the sample coordinate points 104 in the subset. The computer 102 applies a piecewise cubic Hermite interpolation polynomial (PCHIP) to the sample coordinate points 104. In other words, the interpolated points are generated from a mathematical function P(x), which is a piecewise function with each piece specified in Hermite form, i.e., by the values and first derivatives at the endpoints of the piece, and with each piece being a third-order polynomial. Using PCHIP is beneficial because PCHIP is shape-preserving, does not overshoot, and has low oscillation. The interpolated coordinate points 108 are generated at a greater density than the sample coordinate points 104, e.g., three interpolated coordinate points 108 evenly spaced between each consecutive pair of sample coordinate points 104. The density can be chosen based on available computational resources.

Next, in a block 420, the computer 102 generates the reported coordinate points 112, i.e., the coordinate points for which the curvature will be outputted. The reported coordinate points 112 can be selected from the sample coordinate points 104 and interpolated coordinate points 108 at a lower density than the sample coordinate points 104, e.g., every twenty meters, or generated independently at that density. The density can be chosen so that the desired look-ahead distance can be achieved with minimal use of the available computational resources.

Next, in a decision block 425, the computer 102 determines whether there are any remaining reported coordinate points 112 for which the curvature has not yet been outputted. The process 400 cycles through blocks 430-465 below for each reported coordinate point 112. If there are remaining reported coordinate points 112 for the blocks 430-465, the process 400 proceeds to the block 430 to select the next remaining reported coordinate point 112. If the blocks 430-465 have been performed for all the reported coordinate points 112, the process 400 proceeds to a block 470.

In the block 430, the computer 102 selects the next reported coordinate point 112 along the projected path 106. In the current cycle, the blocks 435-465 will be performed on the selected reported coordinate point 112.

Next, in the decision block 435, the computer 102 determines whether, at the reported coordinate point 112, the angle θ between the consecutive vectors 140 between the sample coordinate points 104 is less than the threshold angle. As shown in FIG. 3, the sample coordinate points 104 include, in consecutive order, the first sample coordinate point 104a, the second sample coordinate point 104b, and the third sample coordinate point 104c, and the reported coordinate point 112 is between the first sample coordinate point 104 and the third sample coordinate point 104 along the projected path 106 (or alternatively is the same as the second sample coordinate point 104b). The first vector 140a extends from the first sample coordinate point 104a to the second sample coordinate point 104b, and the second vector 140b extends from the second sample coordinate point 104b to the third sample coordinate point 104c. The angle θ between vectors 140 is measured with the tails of the vectors 140 touching. The threshold angle is chosen to indicate that the lane 110 is sufficiently close to straight for the purposes of actuating the system in the block 470, e.g., one degree. The sample coordinate points 104 as provided in the block 405 may have variable spacing based on the angle θ, with the sample coordinate points 104 spaced farther apart when the angle θ is below the threshold angle than above the threshold angle. In that case, the computer 102 can determine whether the angle θ is below the threshold angle by determining whether the sample coordinate points 104 are farther apart than a threshold distance chosen to correspond to the threshold angle. If the sample coordinate points 104 have variable spacing also based on the speed of the vehicle 100, then the threshold distance can be constant with speed, meaning that the threshold angle varies with speed. In response to the angle θ being less than the threshold angle, the process 400 proceeds to a block 440. In response to the angle θ being greater than the threshold angle, the process 400 proceeds to a block 445.

In the block 440, the computer 102 sets the curvature at the reported coordinate point 112 to zero, and the computer 102 outputs that the curvature at the reported coordinate point 112 is zero. After the block 440, the process 400 returns to the decision block 425 to determine whether there are any more reported coordinate points 112.

In the block 445, the computer 102 fits a curve to the sample coordinate points 104 and the interpolated coordinate points 108 from a third preset distance before the reported coordinate point 112 to the third preset distance after the reported coordinate point. The third preset distance can be half a distance between consecutive reported coordinate points 112. In that case, the curve is fitted to the sample coordinate points 104 and the interpolated coordinate points 108 from halfway between the reported coordinate point 112 and a previous reported coordinate point 112 to halfway between the reported coordinate point 112 and a next reported coordinate point 112, e.g., from ten meters before to ten meters after the reported coordinate point 112 for reported coordinate points 112 spaced twenty meters apart. The curve can be a polynomial, specifically a cubic polynomial. A cubic polynomial provides a sufficiently close fit to a typical roadway 126 while being computationally efficient. The combination of both generating the interpolated coordinate points 108 in the block 415 and fitting a curve to the interpolated coordinate points 108 with the sample coordinate points 104 provides an estimation of curvature that is both accurate and smooth, i.e., has low noise.

Next, in a block 450, the computer 102 calculates the preliminary curvatures $k_i$ of the curve at the intermediate coordinate points before and after the reported coordinate point 112 along the projected path 106. The intermediate coordinate points are a subset of the sample coordinate points 104 and interpolated coordinate points 108, e.g., the sample coordinate points 104 and interpolated coordinate points 108 located within the third preset distance, e.g., ten meters, of the reported coordinate point 112. The curvature $k_i$ at a point i on the curve is an inverse of a radius $R_i$ of the osculating circle at that point i, i.e., $k_i=1/R_i$. For intermediate coordinate points expressed (x, y), the curvature k can be expressed as $$k_i = \frac{|y''|}{(1+(y')^2)^{3/2}}$$

in which y=f(x) is the curve, y' is the first derivative of the curve with respect to x, and y" is the second derivative of the curve with respect to x. If the curve doubles back along the x-dimension, i.e., cannot be expressed as a function y=f(x), a transform can be applied to the curve to place it in functional form.

Next, in a block 455, the computer 102 calculates mean curvatures of at least some of the preliminary curvatures for the intermediate coordinate points. At each intermediate coordinate point, the mean curvature can be an average of the preliminary curvatures that are within a second preset distance before and after the respective intermediate point:

$$\bar{k}_i = \frac{\sum_{j=-N/2}^{N/2} k_j}{N}$$

in which i and j are indexes of the intermediate coordinate points, $\bar{k}_i$ is the mean curvature at point i, $k_j$ is the preliminary curvature at point j, and N is the number of intermediate coordinate points from the second preset distance before to the second preset distance after the reported coordinate point 112. The second preset distance is chosen by balancing smoothness and accuracy of the curve, e.g., seven meters. The second preset distance is less than the third preset distance to better preserve the shape of the curve.

Next, in a block 460, the computer 102 calculates a mean of the mean curvatures, e.g., that are within a first preset distance before and after the reported coordinate point 112 along the projected path 106:

$$\bar{k} = \frac{\sum_{i=-M/2}^{M/2} \bar{k}_i}{M}$$

in which $\bar{k}$ is the mean at the reported coordinate point 112, i is an index of the intermediate coordinate points, $\bar{k}_i$ is the mean curvature at point i, and M is the number of intermediate coordinate points from the first preset distance before to the first preset distance after the reported coordinate point 112.

Next, in a block 465, the computer 102 outputs the mean k as the curvature at the reported coordinate point 112. The curvature is thus based on the generation of the interpolated coordinate points 108, the curve, the preliminary curvatures, and the mean curvatures. For example, the computer 102 can broadcast the curvature over the communications network 120 for other systems of the vehicle 100 to use. After the block 465, the process 400 returns to the decision block 425 to progress to the next reported coordinate point 112, if any remain.

In the block 470, i.e., after the computer 102 determines that there are no more reported coordinate points 112 in the decision block 425, the computer 102 actuates a system of the vehicle 100 based on the curvature. The computer 102 can actuate the propulsion 114, the brake system 116, and/or the steering system 118. For example, the computer 102 may actuate the steering system 118 based on the curvature as part of lane-keeping assist feature. For another example, the computer 102 may actuate the brake system 116 in response to the curvature being above a threshold curvature. The threshold curvature can be speed-dependent and can be chosen to keep the vehicle 100 at an appropriate speed for the curvature of the lane 110. For another example, the computer 102 may operate the vehicle 100 autonomously, i.e., actuating the propulsion 114, the brake system 116, and the steering system 118 based on the curvature without intervention by a human operator. After the block 470, the process 400 ends.

Figure 5:
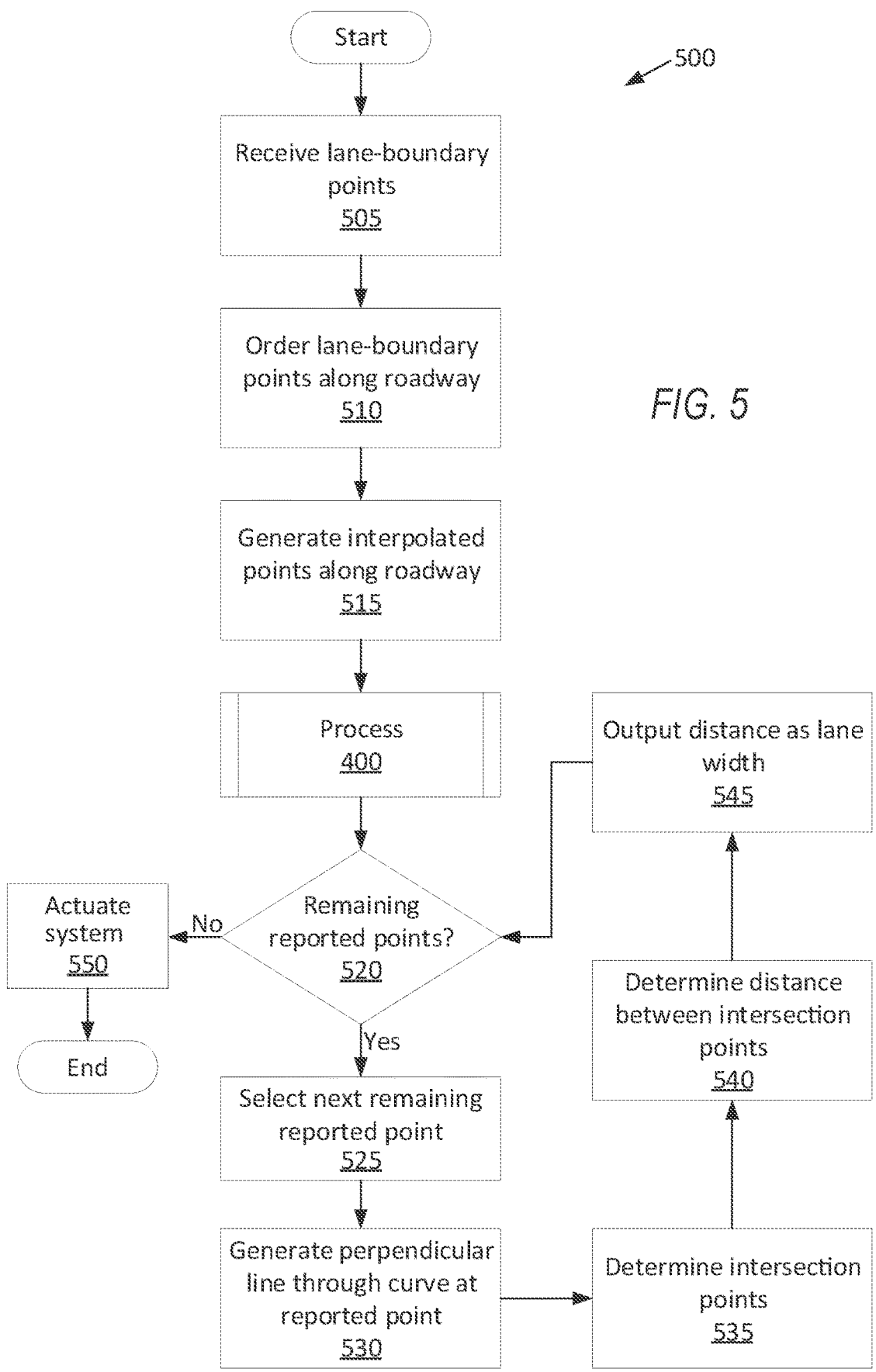
FIG. 5 is a process flow diagram of an example process for outputting a width of the lane of travel of the vehicle.

FIG. 5 is a process flow diagram illustrating an exemplary process 500 for outputting a width of the lane 110 in which the vehicle 100 is traveling. The memory of the computer 102 stores executable instructions for performing the steps of the process 500 and/or programming can be implemented in structures such as mentioned above. As a general overview of the process 500, the computer 102 receives the lane-boundary coordinate points 130, orders the lane-boundary coordinate points 130 according to the projected path 106, and generates interpolated lane-boundary coordinate points 138 between the lane-boundary coordinate points 130 along the projected path 106. The computer 102 also performs the process 400 above. For each reported coordinate point 112, the computer 102 generates a line 132 perpendicular to the curve at the reported coordinate point 112, determines two intersection points 134 with the respective lane boundaries 136, determines a distance between the two intersection points 134, and outputs the distance as the width of the lane 110 at the reported coordinate point 112. The computer 102 actuates a system, e.g., one or more of the propulsion 114, the brake system 116, and the steering system 118, based on the width of the lane 110. The process 500 can be performed for lanes 110 adjacent to the lane 110 in which the vehicle 100 is traveling, up to a maximum number of lanes 110, e.g., five.

The process 500 begins in a block 505, in which the computer 102 receives the lane-boundary coordinate points 130. The computer 102 can receive the lane-boundary coordinate points 130 in the same manner and/or at the same time as receiving the sample coordinate points 104 in the block 405 above. For example, the remote server can transmit the lane-boundary coordinate points 130 to the computer 102 via the transceiver 124. For another example, the computer 102 can access the lane-boundary coordinate points 130 for an upcoming region of a roadway 126 from memory. The lane-boundary coordinate points 130 are located along the lane boundaries 136 of multiple lanes 110 including the lane 110 in which the vehicle 100 is currently traveling, for an upcoming length of the roadway 126, e.g., the next three hundred meters of the roadway 126. The length can be chosen based on the availability of the sample coordinate points 104 and the speed of the vehicle 100, which will dictate how far in advance the width of the lane 110 will be used for actuating the system in a block 545 below, and/or to match up with the length of the sample coordinates received in the block 405. The lane-boundary coordinate points 130 can be represented in two linear orthogonal horizontal dimensions x, y. The lane-boundary coordinate points 130 can be arranged in a preset recurring distance along the respective lane 110, e.g., every five meters; can have varying distances between adjacent lane-boundary coordinate points 130; or a combination of both, e.g., greater density along curved segments and lesser density along straight segments, in addition to possibly varying with the speed of the vehicle 100.

Next, in a block 510, the computer 102 determines the projected path 106 and selects and orders the lane-boundary coordinate points 130 according to the projected path 106. The projected path 106 can be determined as described above with respect to the block 410. The lane-boundary coordinate points 130 are then sorted into the lane boundaries 136 and, for each lane boundary 136, arranged in a series in the order in which the vehicle 100 will cross the lane-boundary 136 coordinate points. The selected lane-boundary coordinate points 130 can be for a number of adjacent lanes 110 up to the maximum number of lanes 110. The maximum number can be chosen based on available resources of the computer 102, e.g., five lanes 110.

Next, in a block 515, the computer 102 generates the interpolated lane-boundary coordinate points 138 along each lane boundary 136 between the lane-boundary coordinate points 130. The computer 102 applies a piecewise cubic Hermite interpolation polynomial (PCHIP), as described above with respect to the block 415, to the lane-boundary coordinate points 130 in each lane boundary 136. The interpolated lane-boundary coordinate points 138 are generated at a greater density than the lane-boundary coordinate points 130, e.g., three interpolated coordinate points 108 evenly spaced between each consecutive pair of lane-boundary coordinate points 130. The density can be chosen based on available computational resources.

Next, the computer 102 performs the process 400. For example, the computer 102 can perform the process 500 and the process 400 in parallel.

Next, in a decision block 520, the computer 102 determines whether there are any remaining reported coordinate points 112 for which the width of the lane 110 has not yet been outputted. The process 500 cycles through blocks 525-545 below for each reported coordinate point 112. If there are remaining reported coordinate points 112 for the blocks 525-545, the process 500 proceeds to the block 525 to select the next remaining reported coordinate point 112. If the blocks 525-545 have been performed for all the reported coordinate points 112, the process 500 proceeds to a block 550.

In the block 525, the computer 102 selects the next reported coordinate point 112 along the projected path 106. In the current cycle, the blocks 525-545 will be performed on the selected reported coordinate point 112. The blocks 525-545 can be performed independently for each lane 110 if the process 500 is being performed for multiple lanes 110 at once.

Next, in a block 530, the computer 102 generates the line 132 perpendicular to the curve at the reported coordinate point 112. For example, the computer 102 can determine the first derivative of the curve at the reported coordinate point 112, and then generate the line 132 as having a slope 90 degrees from the first derivative and as passing through the reported coordinate point 112.

Next, in a block 535, the computer 102 determines the two intersection points 134 between the line 132 and the respective lane boundaries 136 of the lane 110 in which the vehicle 100 is traveling, i.e., the lane 110 containing the reported coordinate point 112. The intersection points 134 are located where the line 132 intersects the interpolated lane-boundary coordinate points 138, i.e., passes through one of the interpolated lane-boundary coordinate points 138 or passes through the vector 140 between two consecutive interpolated lane-boundary 136 coordinate points.

Next, in a block 540, the computer 102 determines the distance between the two intersection points 134, i.e., $$w=\sqrt{(x_1-x_2)^2+(y_1-y_2)^2}$$

in which w is the distance, $(x_1, y_1)$ is one of the intersection points 134, and $(x_2, y_2)$ is the other of the intersection points 134.

Next, in a block 545, the computer 102 outputs the distance w as the width of the lane 110 at the reported coordinate point 112. The width is thus based on the generation of the interpolated lane-boundary coordinate points 138, the curve, and the perpendicular line 132. For example, the computer 102 can broadcast the width over the communications network 120 for other systems of the vehicle 100 to use. After the block 545, the process 500 returns to the decision block 520 to progress to the next reported coordinate point 112, if any remain In the block 550, i.e., after the computer 102 determines that there are no more reported coordinate points 112 in the decision block 520, the computer 102 actuates a system of the vehicle 100 based on the width. The computer 102 can actuate the propulsion 114, the brake system 116, and/or the steering system 118. For example, the computer 102 may actuate the steering system 118 based on the width as part of lane-keeping assist feature. For another example, the computer 102 may operate the vehicle 100 autonomously, i.e., actuating the propulsion 114, the brake system 116, and the steering system 118 based on the curvature. After the block 550, the process 500 ends.

Computer executable instructions may be compiled or interpreted from computer programs created using a variety of programming languages and/or technologies, including, without limitation, and either alone or in combination, Java™, C, C++, Visual Basic, Java Script, Perl, HTML, etc. In general, a processor (e.g., a microprocessor) receives instructions, e.g., from a memory, a computer readable medium, etc., and executes these instructions, thereby performing one or more processes, including one or more of the processes described herein. Such instructions and other data may be stored and transmitted using a variety of computer readable media. A file in a networked device is generally a collection of data stored on a computer readable medium, such as a storage medium, a random access memory, etc. A computer readable medium includes any medium that participates in providing data (e.g., instructions), which may be read by a computer. Such a medium may take many forms, including, but not limited to, non volatile media, volatile media, etc. Non volatile media include, for example, optical or magnetic disks and other persistent memory. Volatile media include dynamic random access memory (DRAM), which typically constitutes a main memory. Common forms of computer readable media include, for example, a floppy disk, a flexible disk, hard disk, magnetic tape, any other magnetic medium, a CD ROM, DVD, any other optical medium, punch cards, paper tape, any other physical medium with patterns of holes, a RAM, a PROM, an EPROM, a FLASH EEPROM, any other memory chip or cartridge, or any other medium from which a computer can read.

The disclosure has been described in an illustrative manner, and it is to be understood that the terminology which has been used is intended to be in the nature of words of description rather than of limitation. The adjectives "first." "second," and "third" are used throughout this document as identifiers and are not intended to signify importance, order, or quantity. Use of "in response to" and "upon determining" indicates a causal relationship, not merely a temporal relationship. Many modifications and variations of the present disclosure are possible in light of the above teachings, and the disclosure may be practiced otherwise than as specifically described.

The invention claimed is:

1. A computer comprising a processor and a memory storing instructions executable by the processor to:
    receive a series of sample coordinate points of a projected path of travel of a vehicle;
    generate interpolated coordinate points along the projected path between the sample coordinate points;
    fit a curve to the sample coordinate points and interpolated coordinate points;
    output a curvature of a lane at a reported coordinate point along the projected path based on the curve;
    calculate preliminary curvatures of the curve at a plurality of intermediate coordinate points before and after the reported coordinate point along the projected path, wherein the intermediate coordinate points are a subset of the sample coordinate points and interpolated coordinate points; and for the intermediate coordinate points, calculate mean curvatures of at least some of the preliminary curvatures.

2. The computer of claim 1, wherein the instructions include instructions to actuate a system of the vehicle based on the curvature.

3. The computer of claim 1, wherein outputting the curvature at the reported coordinate point is based on the preliminary curvatures.

4. The computer of claim 1, wherein the instructions include instructions to calculate a mean of the mean curvatures that are within a preset distance before and after the reported coordinate point along the projected path, and the mean is the curvature at the reported coordinate point.

5. The computer of claim 4, wherein the preset distance is a first preset distance, and calculating each respective mean curvature includes averaging the preliminary curvatures that are within a second preset distance before and after the respective intermediate coordinate point.

6. The computer of claim 5, wherein the intermediate coordinate points are within a third preset distance of the reported coordinate point, the second preset distance is less than the third preset distance.

7. The computer of claim 1, wherein generating the interpolated coordinate points includes applying a piecewise cubic Hermite interpolation polynomial to the sample coordinate points.

8. The computer of claim 1, wherein the curve is a polynomial.

9. The computer of claim 8, wherein the curve is a cubic polynomial.

10. The computer of claim 1, wherein
the sample coordinate points include, in consecutive order, a first sample coordinate point, a second sample coordinate point, and a third sample coordinate point;
the reported coordinate point is between the first sample coordinate point and the third sample coordinate point along the projected path; and
the instructions include instructions to, in response to an angle between a first vector from the first sample coordinate point to the second sample coordinate point and a second vector from the second sample coordinate point to the third sample coordinate point being below a threshold angle, output that the curvature at the reported coordinate point is zero.

11. The computer of claim 1, wherein the instructions include instructions to generate a line perpendicular to the curve at the reported coordinate point, and determine a width of the lane at the reported coordinate point using the perpendicular line.

12. The computer of claim 11, wherein determining the width of the lane includes determining two intersection points between the perpendicular line and two respective lane boundaries, wherein the width of the lane is a distance between the two intersection points.

13. The computer of claim 12, wherein
the instructions include instructions to receive a series of lane-boundary coordinate points of the lane boundaries, and for each lane boundary, generate interpolated lane-boundary coordinate points along that lane boundary between the lane-boundary coordinate points; and
the intersection points are located where the perpendicular line intersects the interpolated lane-boundary coordinate points.

14. The computer of claim 1, wherein the sample coordinate points are located along centers of multiple lanes including the lane, and the instructions include instructions to select a subset of the sample coordinate points according to which of the lanes the projected path is in.

15. The computer of claim 14, wherein only the sample coordinate points in the subset are used to fit the curve.

16. The computer of claim 14, wherein the instructions include instructions to determine the projected path based on navigation directions stored in the memory.

17. The computer of claim 14, wherein the instructions include instructions to determine the projected path based on at least one rule ranking types of lanes.

18. A method comprising:
receiving a series of sample coordinate points of a projected path of travel of a vehicle; generating interpolated coordinate points alongthe projected path between the sample coordinate points;
fitting a curve to the sample coordinate points and interpolated coordinate points;
outputting a curvature of a lane at a reported coordinate point along the projected path based on the curve;
calculating preliminary curvatures of the curve at a plurality of intermediate coordinate points before and after the reported coordinate point along the projected path, wherein the intermediate coordinate points are a subset of the sample coordinate points and interpolated coordinate points; and
for the intermediate coordinate points, calculating mean curvatures of at least some of the preliminary curvatures.

19. A computer comprising a processor and a memory storing instructions executable by the processor to:
receive a series of sample coordinate points of a projected path of travel of a vehicle, wherein the sample coordinate points include, in consecutive order, a first sample coordinate point, a second sample coordinate point, and a third sample coordinate point;
generate interpolated coordinate points along the projected path between the sample coordinate points;
fit a curve to the sample coordinate points and interpolated coordinate points;
output a curvature of a lane at a reported coordinate point along the projected path based on the curve, wherein the reported coordinate point is between the first sample coordinate point and the third sample coordinate point along the projected path; and
in response to an angle between a first vector from the first sample coordinate point to the second sample coordinate point and a second vector from the second sample coordinate point to the third sample coordinate point being below a threshold angle, output that the curvature at the reported coordinate point is zero.

* * * * *